US007129563B2

(12) United States Patent
Cosnier et al.

(10) Patent No.: US 7,129,563 B2
(45) Date of Patent: Oct. 31, 2006

(54) METHOD OF FABRICATING A SEMICONDUCTOR DEVICE COMPRISING A GATE DIELECTRIC MADE OF HIGH DIELECTRIC PERMITTIVITY MATERIAL

(75) Inventors: Vincent Cosnier, Grenoble (FR); Yves Morand, Grenoble (FR); Olivier Kermarrec, Gieres (FR); Daniel Bensahel, Grenoble (FR); Yves Campidelli, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 191 days.

(21) Appl. No.: 10/815,473

(22) Filed: Apr. 1, 2004

(65) Prior Publication Data

US 2004/0256699 A1    Dec. 23, 2004

(30) Foreign Application Priority Data

Apr. 1, 2003    (FR) ................................. 03 04008

(51) Int. Cl.
*H01L 31/0256*    (2006.01)

(52) U.S. Cl. ........................ 257/616; 257/600; 257/119

(58) Field of Classification Search ................ 257/616, 257/600, 119
See application file for complete search history.

(56) References Cited

U.S. PATENT DOCUMENTS

| 5,534,713 | A  | * | 7/1996  | Ismail et al. .................. 257/24 |
| 6,117,750 | A  | * | 9/2000  | Bensahel et al. ........... 438/478 |
| 6,132,806 | A  | * | 10/2000 | Dutartre ................ 427/255.18 |
| 6,255,149 | B1 | * | 7/2001  | Bensahel et al. ........... 438/172 |
| 6,429,098 | B1 | * | 8/2002  | Bensahel et al. ........... 438/478 |
| 6,597,016 | B1 | * | 7/2003  | Yuki et al. .................... 257/77 |
| 6,784,466 | B1 | * | 8/2004  | Chu et al. ................... 257/194 |
| 6,974,735 | B1 | * | 12/2005 | Fitzgerald .................. 438/197 |
| 2004/0256699 | A1 | * | 12/2004 | Cosnier et al. ............. 257/616 |
| 2006/0033095 | A1 | * | 2/2006  | Doyle et al. .................. 257/19 |

\* cited by examiner

*Primary Examiner*—Laura M. Schillinger
(74) *Attorney, Agent, or Firm*—Lisa K. Jorgenson; Stephen Bongini; Fleit, Kain, Gibbons, Gutman, Bongini & Bianco P.L.

(57) ABSTRACT

A process and a device for fabricating a semiconductor device having a gate dielectric made of high-k material, includes a step of depositing, directly on the gate dielectric, a first layer of $Si_{1-x}Ge_x$, where $0.5 < x \leq 1$, at a temperature substantially below the temperature at which a poly-Si is deposited by thermal chemical vapor deposition (CVD).

7 Claims, 1 Drawing Sheet

METHOD OF FABRICATING A SEMICONDUCTOR DEVICE COMPRISING A GATE DIELECTRIC MADE OF HIGH DIELECTRIC PERMITTIVITY MATERIAL

CROSS-REFERENCE TO RELATED APPLICATIONS

This application is based upon and claims priority from prior French Patent Application No. 03 04008, filed on Apr. 1, 2003 the entire disclosure of which is herein incorporated by reference.

FIELD OF THE INVENTION

The present invention relates to a method of fabricating a semiconductor device comprising a gate dielectric made of high dielectric permittivity material and to a semiconductor device such as an MOS and CMOS transistor obtained by this process.

BACKGROUND OF THE INVENTION

The material generally used to form the gate of an MOS transistor, in particular in the case of short-channel transistors (channel length less than 0.18 μm) is polycrystalline silicon (poly-silicon or poly-Si). Conventionally, the gates of these transistors are obtained by high-density plasma etching of a poly-Si layer deposited on a thin layer of dielectric (gate dielectric), typically made of silicon oxide ($SiO_2$), formed on the surface of a single-crystal silicon substrate.

At the present time it is sought to replace the $SiO_2$ layer with a layer of a dielectric having a high dielectric permittivity (high-k material) for low-energy-consumption applications requiring a low leakage current. The introduction of high-k materials for the purpose of replacing $SiO_2$ must firstly be accomplished with a standard poly-Si gate.

In recent years, attempts have been made to develop high-k material as much as the poly-Si gate. It seems that the metal-oxide-type materials investigated hitherto are incompatible with a standard poly-Si gate deposition process. On this subject, the reader may refer to the article "*Compatibility of Polycrystalline Silicon Gate Deposition with $HfO_2$ and $HfO_2/Al_2O_3$ Gate Dielectrics*" by D.C. Gilmer et al., MOTOROLA (APL, Vol. 81, No 7, pp 1288–1290). This is because a large number of short-circuit-type defects are generated, of the order of $10^4$ defects per $cm^2$.

From studies and observations made by the inventors, which are the basis of the present invention, it is considered that the appearance of these defects is probably due to direct interaction between, on the one hand, the gases used during deposition of the poly-Si gate, namely silane ($SiH_4$) and hydrogen ($H_2$), and, on the other hand, the surface of the high-k material, owing to the high temperature, of around, but not limited to, 550° C., at which this deposition is carried out. When the high-k material is a layer of hafnium oxide ($HfO_2$), the interaction in this case is an Hf/Si-type interaction that occurs at temperatures of around, but not limited to, 550° C. or higher.

To alleviate this problem, two approaches are in principle conceivable: the first would be to modify the high-k material and the second would be to modify the gate.

Regarding the first approach, it is known that many studies have been carried out in order to modify the high-k material, but this generally results either in a reduction in the dielectric permittivity (k) or in an increase in the number of fixed charges in the material, having the effect of degrading the characteristics of the transistors. On this subject, the reader may refer to the article "*Effect of Nitrogen in HfSiON Gate Dielectrics on the Electrical and Thermal Characteristics*" M. Koyoma et al., Toshiba Corporation (IEDM 2002), which is hereby incorporated by reference in its entitety.

As regards the second approach, it is also known that the use of a metallic gate, especially a gate made of titanium nitride (TiN), does admittedly avoid the problem of generating defects, but it poses many problems of integration and of compatibility with an FEOL (Front-End Of the Line) process. In particular, it is preferable to maintain a poly-Si gate that offers the possibility of n-doping or p-doping by ion implantation.

Moreover EP-A1-0 887 843 teaches a transistor having a Si/SiGe composite gate, that comprises a $SiO_2$ layer on a Si semiconductor substrate, a Si tie layer with a thickness of less than or equal to 1 nm on the $SiO_2$ layer, and a polycrystalline $Si_{1-x}Ge_x$ layer, where $0<x\leq y$, with a thickness of around, but not limited to, 2 to 20 nm, on this tie layer, the $Si_{1-x}Ge_x$ being surmounted by a Si layer. The tie layer is deposited at a temperature of between 500 and 580° C., typically 550° C. This is why the aforementioned interactions of the Hf—Si type would occur at the interface with the layer of high-k material if such a layer were to replace the $SiO_2$ layer.

According what is needed is a method and system to over come the problems encountered in the prior art and to provide a transistor gate that is less aggressive with respect to the high-k material in the first steps of depositing the gate, but that is also compatible with the conventional fabrication processes, especially including the adjustment of the gate work function by ion implantation.

SUMMARY OF THE INVENTION

Briefly, in accordance with a first aspect of the present invention relates to a method of fabricating a semiconductor device having a gate dielectric made of high dielectric permittivity material, that includes a step of depositing, directly on the gate dielectric, a $Si_{1-x}Ge_x$ first layer, where $0.5<x\leq 1$, at a temperature substantially below the temperature at which the poly-Si is deposited by thermal CVD.

The method, in one embodiment, furthermore includes a step of depositing a $Si_{1-y}Ge_y$ second layer, where $0\leq y\leq 1$, on top of the $Si_{1-x}Ge_x$ first layer.

A second aspect of the present invention relates to a semiconductor device comprising, on a substrate, a gate dielectric made of high dielectric permittivity material and, on top of the gate dielectric, a gate comprising a $Si_{1-x}Ge_x$ first layer, where $0.5<x\leq 1$, directly on the gate dielectric.

Thus, the present invention uses $Si_{1-x}Ge_x$, where $0.5<x\leq 1$, for the first deposition step carried out directly on the high-k material, during production of the gate, so as to stabilize the interface between the high-k material and the gate, without degrading the high-k material. Once this interface has been established, the conventional process for producing the poly-Si gate is then continued, with the associated thermal budgets.

BRIEF DESCRIPTION OF THE DRAWING

The subject matter, which is regarded as the invention, is particularly pointed out and distinctly claimed in the claims at the conclusion of the specification. The foregoing and other features, and advantages of the invention will be apparent from the following detailed description taken in conjunction with the accompanying drawings in which:

DESCRIPTION OF THE PREFERRED EMBODIMENTS

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The device here is, for example, the gate of an MOS transistor, which is a particular case of a capacitor plate. However, it is quite clear that the invention is not limited to this example, rather it applies to the production of any semiconductor device comprising a gate dielectric made of high-k dielectric.

FIGS. 1 to 5 show, in cross section, that portion of a silicon substrate 1 that corresponds to an active zone for producing the gate of the MOS transistor. The active zone is, for example, part of a p-doped native substrate, in order to produce an n-channel MOS transistor (nMOS transistor). To produce a p-channel MOS transistor (PMOS transistor), the active zone is, for example, an n-doped well in a p-doped native substrate.

Figure 6:
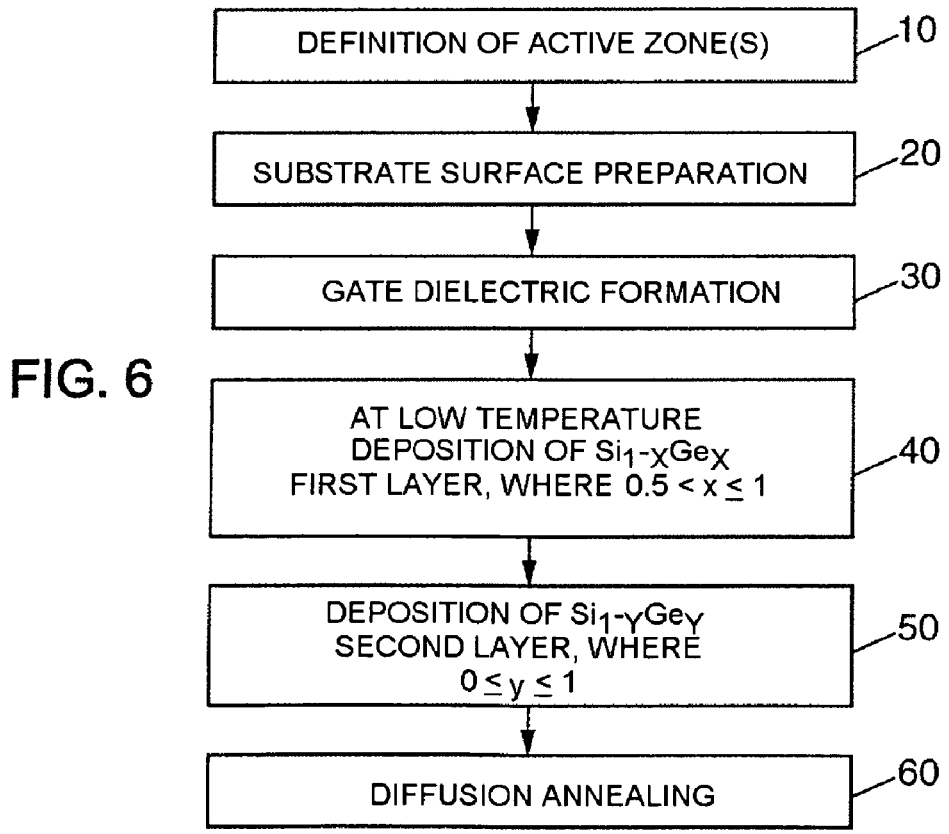
FIG. 6 is a diagram of the steps illustrating an example of a method according to the present invention.

FIG. 6 illustrates the steps of an example of how the present invention is carried out.

Applications of the invention are, in particular, in the fabrication of MOS transistors in CMOS technology or the like.

Figure 1:
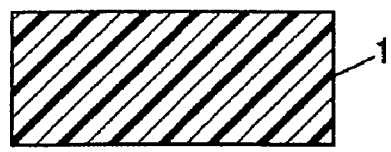
FIGS. 1 to 5 are schematic sectional views illustrating an example of a semiconductor device according to the main steps of the method of forming the gate on top of a layer of high-k material in accordance with the present invention.

Starting from a native silicon substrate, the first step 10 consists in defining at least one active zone as illustrated in FIG. 1.

The second step 20 consists in preparing the surface of the substrate, in the active zone, for the purpose of depositing the high-k dielectric. In one embodiment, this step includes the formation of a very thin layer of gate oxide, made of $SiO_2$ or the like (SiON, etc).

Figure 2:
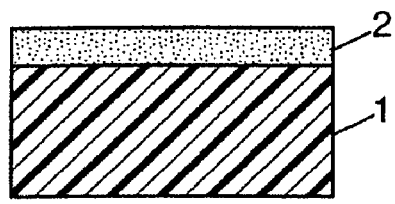

FIG. 2 illustrates the third step 30 of producing the gate oxide layer on the surface of the substrate 1 by depositing a high-k-type dielectric, for example $HfO_2$. This step comprises:

the formation of an oxide layer, having a thickness of about, but not limited to, 0.7 nm, by ozone chemistry;

the deposition of an $HfO_2$ layer, having a thickness of about, but not limited to, 4 nm, for example by ALCVD (Atomic Layer Chemical Vapor Deposition) at a temperature of around, but not limited to, 300° C.; and an annealing operation at about, but not limited to, 600° C. in the presence of nitrogen ($N_2$) for about, but not limited to, 1 minute.

A gate oxide layer 2 made of crystallized $HfO_2$ is thus obtained.

It shall be noted that other dielectrics of the metal oxide type are encompassed within the true scope and spirit of the present invention, for example other metal oxides such as zirconium oxide ($ZrO_2$), hafnium silicate (HfSiO) and zirconium silicate (ZrSiO).

Steps 10, 20 and 30 are indicated here, according to one example of how to carry out the process, for the sake of clarity of the description. However, it is quite obvious that these are not themselves constitutive of the process according to the present invention.

Figure 3:
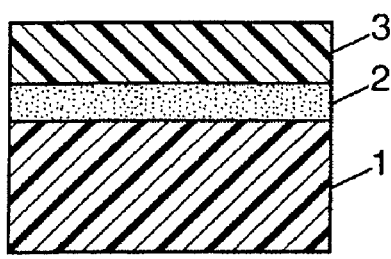

In the fourth step 40 illustrated in FIG. 3, a layer 3 of polycrystalline $Si_{1-x}Ge_x$, where $0.5 < x \leq 1$, is then deposited at low temperature directly on the gate oxide layer 2.

The term "low temperature" is understood, here and below, to mean a temperature substantially below the temperature of Si deposition by thermal CVD (Chemical Vapor Deposition) using a $SiH_4/H_2$ gas mixture, this temperature being in general equal to 550° C. or higher.

Preferably, the layer 3 in one embodiment is deposited at a temperature between 400 and 500° C., or better still between 400 and 450° C. It has been observed that, at such a temperature, degradation of the high-k material is avoided.

In a first implementation example, the deposition is carried out in this step 40 by thermal CVD using a gas mixture containing $SiH_4$ and/or $GeH_4$ diluted in $H_2$, typically to 10%.

In this case, it is preferable for $0.7 \leq x \leq 1$. This is because the higher the Ge content, the lower the deposition temperature may be. Thus, to deposit a layer of pure Ge (x=1), the temperature may be approximately 400° C.

This deposition is less aggressive than deposition by thermal CVD based on $SiH_4$ diluted in $H_2$, which typically is carried out with a thermal budget of 550° C. The interface between the high-k material and the gate is therefore stabilized without degrading this material.

The proportions of the various gases of the gas mixture for the $Si_{1-x}Ge_x$ layer vary according to x and may be easily determined by those of average skill in the art on the basis of the Ge and Si contents desired for this layer.

The total deposition pressure is generally a low pressure, that is to say below atmospheric pressure.

The duration of the deposition depends on the temperature and pressure conditions, on the proportions of the various gases in the gas mixture and on the desired thickness of the polycrystalline $Si_{1-x}Ge_x$ layer 3. For example, the thickness of this layer is between 5 and 30 nm.

Advantageously, since the Ge content of the gate is high (x>0.5), the poly-depletion of the gate is greatly improved. In this regard, reference may be made to the article "*Enhancement of PMOS Device Performance with Poly-SiGe Gate*", by Wen-Chin Lee et al., IEEE (EDL 1999, Vol.20, No. 5, pp 232–234).

Figure 4:
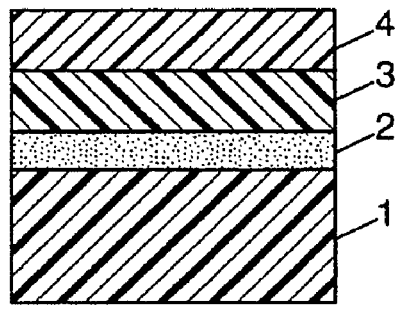

In the fifth step 50 illustrated in FIG. 4, a second layer 4, for example made of poly-Si, is then deposited on top of the layer 3 so as to complete the thickness of the gate to about, but not limited to, 150 nm in total.

It should be noted that the deposition in this step 50 does not need to be carried out at low temperature (in the sense indicated above), since the interface between the layer of high-k material and the $Si_{1-x}Ge_x$ first layer, that is to say between the layer 2 and the layer 3, has already stabilized. There is therefore no possible interaction of the Hf/Si type.

As a variant, the layer 4 may be made of polycrystalline $Si_{1-y}Ge_y$, where $0 \leq y \leq 1$.

This step 50 may advantageously be carried out in the same reactor as step 40. As required, only the gas mixture is different.

In the sixth step 60, which is optional, a diffusion annealing operation may be carried out in order to obtain interdiffusion of the Ge and/or Si between the layers 3 and 4, that is to say diffusion of the Ge and/or of the Si of the layer 3 into the layer 4 and/or, conversely, of the layer 4 into the layer 3. This step is beneficial, in particular if the layer 3 is predominantly Ge, or even pure Ge, and/or if the layer 4 is predominantly Si, or even pure Si.

This annealing operation therefore makes it possible to obtain a gate of the polycrystalline SiGe type.

By correctly choosing the annealing parameters, especially the time and the temperature, it is advantageously possible to obtain an interface between the high-k material and the gate (interface between the layers 2 and 3) that is predominantly Si. In this way, the mid-gap gate effect due to p$^+$-doped pure Ge is avoided. A compromise may be found so as to maintain the advantage resulting from the presence of Ge as regards poly-depletion.

Figure 5:
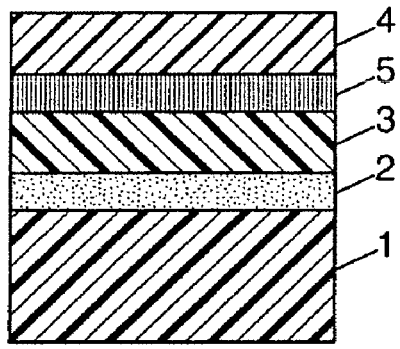

Alternatively, it is also possible to form a layer 5 that limits the interdiffusion of Ge and Si, this layer being deposited between the layers 3 and 4, so as to limit the diffusion of Ge and of Si from one of these layers into the other, and vice versa, during the subsequent annealing operations. The layer 5 is, for example, a superficial layer of silicon nitride or silicon oxide with a thickness of less than or equal to 1 nm. A process for obtaining such a layer is described for example in Patent Application FR-A-2 775 119. The configuration illustrated in FIG. 5 is then obtained.

Finally, in the next steps, the other steps in the production of the MOS transistor according to the standard process are completed. These other steps include etching of the gate and production of the spacer around the gate (with deposition and optionally removal of the masks needed for this purpose). The next steps may also include the implantation of the n$^+$ or p$^+$ dopants for applications in CMOS technology, and their activation by annealing.

According to one advantage of the present invention, the polycrystalline SiGe (poly-SiGe) gate may thus be treated as a standard poly-Si gate in order to adjust the gate work function by ion implantation.

Optionally, an encapsulation layer may be added to the gate, covering the layer 3 and/or the layer 4, so as to protect the germanium from oxidation and from possible evaporation of its oxide. This encapsulation layer may be of SiO$_2$, and obtained using a standard deposition process.

In pMOS and nMOS applications, the layer 3 and/or the layer 4 may be doped in situ as p$^+$ with boron (B) atoms or as n$^+$ with phosphorus (P) atoms respectively. The expression "in situ doping" is understood to mean doping in the presence of dopants in the gas mixture used to deposit the layer in question. For this purpose, it is sufficient to add phosphine (PH$_3$), or alternatively diborane (B$_2$H$_6$), to the gas mixture used for depositing these layers by thermal CVD (first implementation example for the layer 3).

In situ doping is recommended when a layer for limiting the interdiffusion of Ge and Si, as mentioned above, is provided. Specifically, the layer may form a barrier to the diffusion of the dopants into the interface between the layers 2 and 3.

The present invention has been described above in the case of a general implementation example that is not limiting.

In a one particular implementation example, a provision is made for the layer 3 and the layer 4 to be both SiGe compounds having a high Ge content, for example greater than 70%, i.e. Si$_{1-x}$Ge$_x$ where $0.7<x\leq1$. This allows better control of the Ge concentration in the final gate.

In another implementation example, Ge may be the only material of the gate. In other words, the layers 3 and 4 are then made of pure Ge (x=1). This may be advantageous in the context of a complete process by thermal CVD with a low thermal budget.

Although a specific embodiment of the present invention has been disclosed, it will be understood by those having skill in the art that changes can be made to this specific embodiment without departing from the spirit and scope of the present invention. The scope of the present invention is not to be restricted, therefore, to the specific embodiment, and it is intended that the appended claims cover any and all such applications, modifications, and embodiments within the scope of the present invention.

What is claimed is:

1. A semiconductor device comprising:
   a substrate;
   a gate dielectric deposited on the substrate, wherein the gate dielectric is made of high dielectric permittivity material; and
   a gate formed on top of a Si$_{1-x}$Ge$_x$ first layer comprising:
   a Si$_{1-x}$Ge$_x$ first layer formed directly on the gate dielectric, where $0.5<x\leq1$; and,
   a Si$_{1-y}$Ge$_y$ second layer, formed on top of the Si$_{1-x}$Ge$_x$ first layer where $0\leq y\leq1$.

2. The semiconductor device of claim 1, wherein at least one of the Si$_{1-x}$Ge$_x$ first layer and the Si$_{1-y}$Ge$_y$ second layer is predominantly Ge.

3. The semiconductor device of claim 1, wherein the gate further comprises a layer for limiting a diffusion of at least one of Ge and Si between the Si$_{1-y}$Ge$_y$ second layer and the Si$_{1-x}$Ge$_x$ first layer.

4. The semiconductor device of claim 1, wherein the gate dielectric is selected in a group of metal oxides consisting of HfO$_2$, ZrO$_2$, HfSiO and ZrSiO.

5. The semiconductor device of claim 1, wherein x=1.

6. The semiconductor device of claim 1, wherein x=y=1.

7. The semiconductor device of claim 1, wherein an interface between the gate dielectric and the gate is predominantly made of Si.

* * * * *